STABILIZED SEMI-CONDUCTOR OSCILLATOR CIRCUITS

Filed Nov. 6, 1953 2 Sheets-Sheet 1

INVENTOR.
RAYMOND P. MOORE, JR.

BY H. L. Newton
ATTORNEY

INVENTOR.
RAYMOND P. MOORE, JR.
BY H. C. Newton
ATTORNEY 2,791,693

STABILIZED SEMI-CONDUCTOR OSCILLATOR CIRCUITS

Raymond P. Moore, Jr., Baltimore, Md., assignor to Radio Corporation of America, a corporation of Delaware Application November 6, 1953, Serial No. 390,592

13 Claims. (Cl. 250—36)

Figure 1:
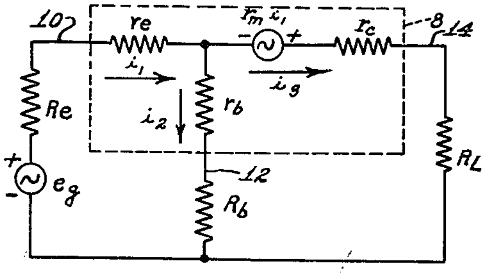

This invention relates to semi-conductor oscillator circuits, and in particular to means for stabilizing oscillator circuits which utilize transistors.

The recent development of commercially useful semiconductor devices of the type employing a semi-conductive element having three contacting electrodes has already had a decided effect upon and has caused the introduction of many new techniques in the electronic signal communication field. These devices, which are known extensively as "transistors," are small in size, especially when compared with the ordinary vacuum tube, require no heater power, are very durable, and consist of materials which appear to have long life. Hence, the use of transistors in oscillator as well as other electrical circuits for communications and the like has been, and is, the subject of considerable investigation.

Transistors normally are of two general classes, which are known presently as the point-contact transistor and the junction transistor. Point-contact transistors comprise, in general, a body of semi-conductive material, such as germanium or silicon, and three contacting electrodes which have been designated as the emitter electrode, the collector electrode and the base electrode. The semi-conductive body may be either of the N or P type. If the body is of the N type, the emitter electrode is normally biased positively to be in a relatively conducting direction, and the collector electrode negatively to be in a relatively non-conducting direction, each with respect to the base electrode. If the body is of the P type, the potentials are reversed. It is also known that point-contact transistors will have a negative resistance characteristic under certain operating conditions.

As used herein, a bias voltage in the curent conducting direction will be referred to as a "forward bias," and a bias voltage having a polarity which opposes current flow will be referred to as a "reverse bias."

The present invention is directed in general to circuits which utilize point-contact transistors of either the P or N type. Circuits which utilize point-contact transistors and which are arranged as oscillator circuits of several different types, including sine wave oscillators, are well known. Thus, it has been found that by connecting a resonant circuit, such as a parallel resonant circuit, between the base electrode and a point of fixed potential, sine wave oscillations can be produced at a frequency which is controlled by the resonant frequency of the parallel resonant circuit. This mode of operation occurs by virtue of the negative resistance characteristic of the semi-conductor device which exists under predetermined operating conditions as referred to above. Transistor oscillator circuits of this type have been disclosed, for example, in an article titled "Some Novel Circuits for the Three Terminal Semi-Conductor Amplifier," by Webster, Eberhard and Barton, which appears at page 5 of the March 1949 issue of "RCA Review." In a further known embodiment of a sine wave oscillator utilizing transistors, an external feedback path may be provided between selected electrodes. Such a feedback system may be constructed so as to provide a phase shift which is complementary to that in the transistor, and thereby permits the oscillator to operate at higher frequencies.

The present invention relates more particularly to transistor sine wave oscillator circuits of the types hereinbefore referred to. In utilizing transistor oscillator circuits of these types, it has been found that one of the difficulties encountered is produced by variations in the ambient temperature. In particular, changes in ambient temperature may cause the oscillator circuits to cease oscillating or, at the very least, produce amplitude on frequency instability thereof.

An explanation for the above mentioned difficulties with conventional transistor oscillator circuits is that they are due to changes in the collector resistance of the transistor as the ambient temperature changes. The resistance of the collector electrode may either increase or decrease with increases of temperature, although generally it will decrease. Since the amplitude of oscillations will vary in proportion to the variations in collector resistance, it follows that ambient temperature variations wil produce corresponding amplitude variations of the oscillatory signals in oscillator circuits of the types referred to. Furthermore, if the change in the collector resistance is great enough, oscillations will stop. This invention relates to means for compensating for these ambient temperature variations, thereby insuring oscillator operation which is characterized by amplitude and frequency stability irrespective of reasonable ambient temperature variations.

It is, accordingly, a principal object of the present invention to provide improved transistor oscillator circuits wherein continuous highly stable operation is attained.

It is another object of this invention to provide improved sine wave oscilator circuits utilizing semi-conductor devices in which changes in operational characteristics tending to cause cessation of oscillations and amplitude and frequency variations due to ambient temperature variations are compensated for.

It is yet another object of the present invention to provide means for stabilizing the oscillation amplitude of a transistor oscillator circuit as the ambient temperature of the circuit changes.

These and further objects of the present invention are achieved by connecting a thermally sensitive resistance device such as, by way of example, a "thermistor" in series with the base electrode and emitter electrode of a semi-conductor device connected in an oscillator circuit. The position of the thermistor in the circuit will depend on whether the collector resistance increases or decreases with temperature changes. By providing this expedient, it has been found that the amplitude as well as the frequency of oscillations may be stabilized to a high degree and that the oscillations will be less likely to cease with changes in ambient temperature.

Figure 2:
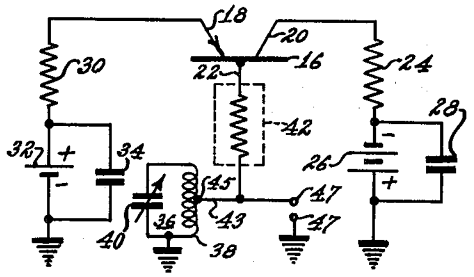
Figure 7:
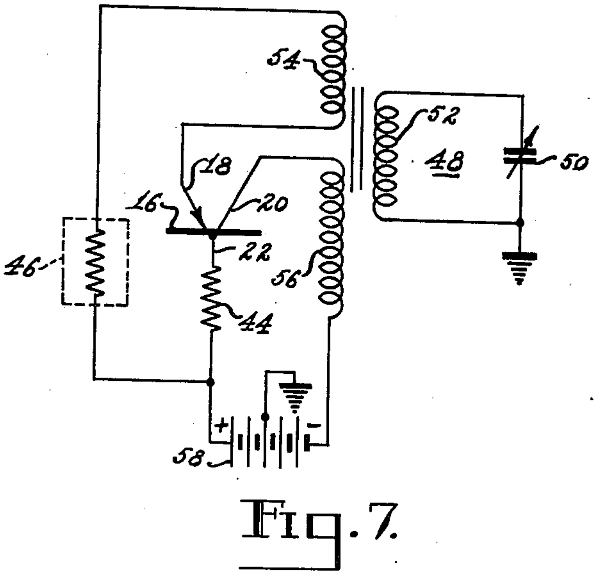

The novel features that are considered characteristic of this invention are set forth with particularity in the appended claims. The invention itself, however, both as to its organization and method of operation, as well as additional objects and advantages thereof, will best be understood from the following description when read in connection with the accompanying drawing, in which:

Figure 1 is the conventional equivalent circuit diagram of a transistor oscillator circuit adapted for operation in accordance with the invention; and Figures 2 and 7 are schematic circuit diagrams of transistor oscillator circuits embodying the present invention, and illustrating various forms thereof.

Referring now to the drawing, wherein like reference numerals indicate like circuit elements throughout, and particularly to Figure 1, the conventional T-network equivalent circuit of a transistor connected as an oscillator is represented within the dotted rectangle 8. The T-network comprise 3 arms respectively, including an emitter resistance $r_e$, a base resistance $r_b$, and a collector resistance $r_c$ in series with an impedanceless voltage generator developing a voltage $r_m i_1$, wherein $r_m$ is a resistance. The emitter, base and collector electrodes appear respectively at the points 10, 12 and 14. The emitter current $i_1$ and the collector current $i_3$ have also been indicated in Figure 1. To provide the proper biasing potentials, an external emitter impedance such as resistor $R_e$ is connected to the emitter electrode, and similarly, an external resistor $R_b$ is connected to the base electrode. A load resistor $R_L$ may be connected to the collector electrode. A source of signal voltage $e_g$ may also be provided and is indicated connected between the base electrode and the emitter electrode.

By using conventional circuit analysis, it can be shown that the following expression is a necessary and sufficient condition for oscillation:

$$(r_c+R_L)(r_e'+r_b')=r_b'(r_m-r_e')$$

where $$r_e'=r_e+R_e$$

and where $$r_b'=r_b+R_b$$

It is apparent from this equation that any variations in the collector electrode resistance $r_c$ will spoil the equality of the equation and cause oscillations to cease unless one or more of the remaining circuit resistances can be changed. It has been observed, as referred to above, that the resistance of the collector electrode apparently changes as the ambient temperature of the oscillator circuit is varied. It has been further observed that these changes in collector electrode resistance may be either positive or negative with increases in the ambient temperature, depending apparently on the particular characteristics of different individual transistor devices. Generally, however, the collector resistance decreases with increases in temperature. The apparent changes in the collector electrode resistance will also vary the amplitude of the oscillations. Thus, the changes in the collector electrode resistance are an apparent obstacle to the goal of achieving continuous oscillation and amplitude stability in transistor oscillator circuits.

It can be shown, by referring to the equation, that negative changes in the collector electrode resistance (i. e., $r_c$ is decreased) can be compensated for to maintain the equality of the expression by either increasing the resistance of the resistor $R_e$ in the emitter electrode circuit, or by decreasing the resistance of the resistor $R_b$ in the base electrode circuit. Conversely, it can be further shown that positive changes in the collector electrode resistance (i. e., $r_c$ is increased) can be compensated for to maintain the equality of the expression by either decreasing the resistance of the resistor $R_e$ in the emitter electrode circuit, or by increasing the resistance of the resistor $R_b$ in the base electrode circuit.

In accordance with the present invention, these apparent changes of collector electrode resistance are compensated for by adding a compensating impedance means to either the base electrode circuit or the emitter electrode circuit to achieve the desired stability of the oscillator. The application of these principles, in accordance with the novel features of the present invention, can be better understood by referring now to Figure 2 of the drawing.

The oscillator circuit shown comprises a semi-conductor device having a block or body 16 of semi-conductive material consisting, by way of example, essentially of a chemical element having semi-conducting properties such as germanium, silicon, barium, tellurium or selenium containing a small but sufficient number of atomic impurity centers or lattice imperfections as commonly employed for best results in crystal rectifiers. Germanium is the preferred material for block 16 and may be prepared to form an N type semi-conductor crystal as is well known.

The semi-conductive body 16 is provided with an emitter electrode 18, a collector electrode 20, and a base electrode 22. The emitter electrode 18 and the collector electrode 20 usually form small area contacts with the semi-conducting body 16 and they consist, for example, of point electrodes of tungsten or Phosphor bronze wires having a diameter of 2–5 mils and usually spaced less than 5 mils apart. Although the emitter electrode 18 and the collector electrode 20 are normally point electrodes, it is only essential that they be rectifying electrode having a relatively high contact resistance with the body 16. The emitter electrode 18 and the collector electrode 20 may be provided on the same surface of semi-conductive body 16 or they may be arranged on opposite surfaces of semi-conductive body 16 spaced a few mils apart. The base electrode 22 normally forms a relatively low resistance contact with the semi-conductive body 16 and usually has a relatively large contact area with the body 16. The base electrode 22 is a non-rectifying electrode.

As explained above, it is desirable that oscillation be continuous and stable under predetermined operating conditions, particularly as the ambient temperature changes. In those cases where the ambient temperature of the circuit is increased, however, the oscillations may be subject to variations in amplitude or frequency or be subject to interruptions. In accordance with the present invention, therefore, an impedance element is incorporated having characteristics such that the variation in collector electrode resistance is compensated for. In the circuit of Figure 2, this is accomplished by connecting the compensating impedance element 42 in the base electrode circuit in series between the base electrode 22 and the parallel resonant circuit 36. The impedance element 42 may be any of the well known types which are sensitive to temperature changes and have either a large negative or positive temperature coefficient.

By way of example only, negative temperature coefficient elements such as thermistors have been chosen to illustrate the principles of the present invention. It should be understood, however, that the invention is not limited thereto, and that elements having a positive temperature coefficient, such as copper wire, may be used equally well. Thermistors, as is well known, are made from a semi-conductor material such as uranium oxide or silver sulfide. The specific resistance of such devices decreases rapidly with increases in temperature.

The parallel resonant circuit 36 includes an inductor 38 and a capacitor 40 which may be variable as shown. The impedance compensating element 42 may be connected to parallel resonant circuit 36 through a lead 43 which is connected to a tap 45 on the inductor 38. The tap 45 preferably is provided on the upper portion of inductor 38 for the purpose of matching impedances between the resonant circuit 36, the base electrode 22 and the impedance element 42. The parallel resonant circuit 36 may also be inductively coupled to the base electrode 22 as described.

The collector electrode 20 is supplied with a relatively large reverse bias voltage. To this end, a source of operating bias which may be a battery 26, is provided and has its positive terminal grounded. The battery 26 is shunted by an alternating current bypass capacitor 28. A load resistor 24 is connected between the collector electrode 20 and the negative terminal of the battery 26.

A relatively small forward bias is supplied to the emitter electrode 18. To this end, a battery 32 has its negative terminal grounded while its positive terminal is connected to the emitter electrode 18 through a resistor 30. The battery 32 is shunted by an alternating current bypass capacitor 34.

The circuit of Figure 2 will function as a sine wave oscillator, as is well known. The theory of its operation has been explained by Webster, Eberhard and Barton as referred to hereinbefore. The reactive impedance of a parallel resonant circuit such as 36 is very high at the resonant frequency. Accordingly, a high impedance is provided between the base electrode 22 and ground under these conditions, and the circuit will oscillate due to its inherent negative resistance. The frequency of oscillation is determined by the resonant frequency of the circuit 36 and by the applied bias voltages. The sine wave signal output may be taken from the terminals 47.

In the circuit just described, it is assumed that the collector electrode resistance $r_c$ is observed to decrease with increases in the ambient temperature, thereby decreasing the amplitude of oscillations or even causing oscillation to cease. As was pointed out in connection with the description of Figure 1, under such conditions the resistance of the base electrode circuit may be decreased to compensate for the decrease in collector electrode resistance. By providing an impedance element, such as the thermistor 42 in the base electrode circuit, whose resistance decreases with increase in ambient temperature, continuous and stable oscillation may be maintained. It should be understood that the same results may be achieved by connecting a positive temperature coefficient element in series with the emitter 18. Thus, the present invention provides a simple and reliable means for maintaining perpetuity and stability in semi-conductor oscillator circuits. It also has been found that such an expedient is a material aid in maintaining frequency stability with temperature variations.

Figure 3:
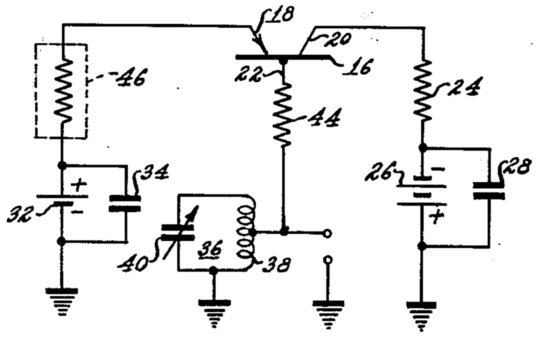

Referring now to Figure 3, an oscillator circuit includes the semi-conductive body 16 having three electrodes connected to operate in substantially the same manner as the circuit illustrated in Figure 2. Here, however, it is assumed that the collector electrode resistance $r_c$ increases with increases in the ambient temperature, thereby increasing the amplitude of oscillations. As was pointed out in connection with the description of Figure 1, under these conditions the resistance in the emitter electrode circuit may be decreased to compensate for the increase in collector electrode resistance. By connecting an impedance element such as the thermistor 46 in series between the emitter electrode 18 and the positive terminal of the biasing battery 32, amplitude stability of the circuit may be maintained.

Figure 4:
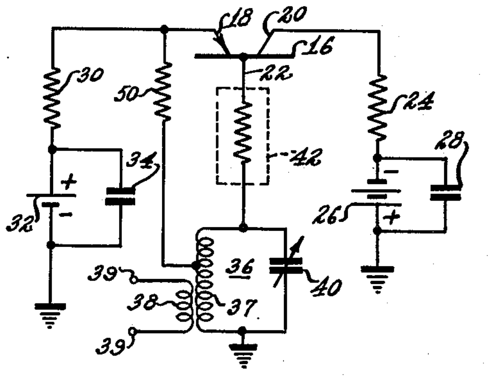

The sine wave oscillator of Figure 4 differs mainly from that of Figures 2 and 3 by the provision of resistor 50 connected between the emitter electrode 18 and a tap on the inductor 37 of resonant circuit 36. A thermistor 42 is connected in series between the base electrode 22 and the parallel resonant circuit 36 as in Figure 2.

As in the case of Figure 2, it is assumed that the collector electrode resistance $r_c$ decreases with increases in the ambient temperature, thereby decreasing the amplitude of oscillations or causing the oscillations to cease. By providing the thermistor 42 in the base electrode circuit, whose resistance decreases with increases in temperature, the stability of the circuit may be maintained.

The operation of the oscillator of Figure 4 is substantially the same as that of the oscillators of Figures 2 and 3. The resistor 50 provides an external feedback path between the base electrode 22 and the emitter electrode 18. Accordingly, the sine wave oscillator of Figure 4 may be considered to be analogous to a conventional Hartley oscillator. It is to be understood that the resistance of the resistor 50 may be zero or infinite. However, resistor 50 will permit the oscillator to operate at higher frequencies by providing a frequency shift between the oscillating input and output current. The phase shift network consists of the resistor 50 and the capacitance of the bulk material that exists in the semi-conductive body between the emitter electrode 18 and the base electrode 22. A sine wave may be obtained from the output terminals 39 connected to the inductor 38 which is inductively coupled to inductor 37 of the resonant circuit 36.

Figure 5:
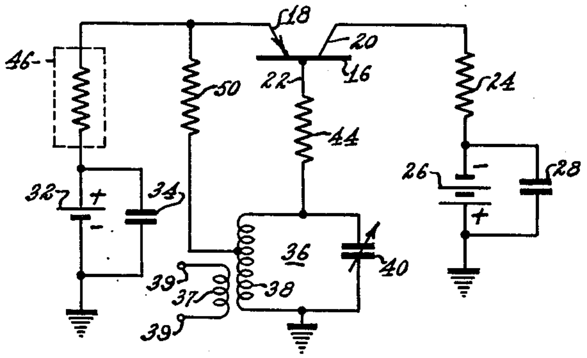

Referring now to Figure 5, a sine wave oscillator is connected for operation in a manner substantially identical with that of the oscillator illustrated in Figure 4. Here, however, it is assumed that the collector electrode resistance $r_c$ increases with increases in the ambient temperature. As was explained above, the amplitude of oscillations will also tend to increase under these conditions unless compensating elements are added. As in Figure 3, therefore, the resistance in the emitter electrode circuit may be decreased to compensate for the increase in collector electrode resistance. Accordingly, by providing an impedance element such as the thermistor 46 in the emitter electrode circuit, whose resistance decreases with increases in temperature, amplitude stability of the oscillator may be maintained.

Figure 6:
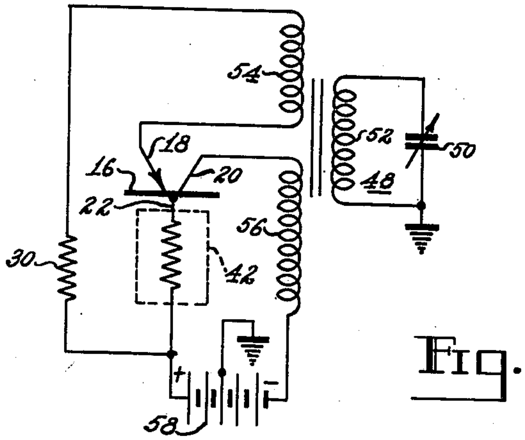

Referring now to Figures 6 and 7, and the stabilized oscillator circuits shown therein, the semi-conductive body 16 has inductive windings 54 and 56, connected with its emitter electrode 18 and its collector electrode 20, respectively, in each of these figures. Each of the windings 54 and 56 are inductively coupled with an inductor 52 of a frequency determining parallel resonant or tank circuit 48, which also includes a tuning capacitor 50. The windings 54 and 56 and the resonant circuit 48 provide regenerative or positive feedback between the output or collector electrode 20 and the input or emitter electrode 18 of the semi-conductive body 16.

A single battery 58, which has an intermediate point grounded, as shown, provides biasing voltages for the transistor. Thus, if the transistor is of the N point-contact type, the emitter will be biased in a forward direction with respect to the base, and the collector will be biased in a reverse direction, also with respect to the base.

If it is assumed the collector electrode resistance $r_c$ decreases with increases in the ambient temperature, thus decreasing the amplitude of oscillations or causing them to cease, the thermistor 42 connected to the base 22 as shown in Figure 6 will compensate for these temperature increases. If, on the other hand, the collector electrode resistance $r_c$ increases with increases in temperature, the thermistor 46 connected to the emitter 18 through the winding 54 as shown in Figure 7 will compensate for the temperature increases. Thus, temperature compensation is provided for stable operation in a manner similar to that already discussed for Figures 2 to 5. It should be understood that in Figures 6 and 7, as in the preceding figures, a positive temperature coefficient element, such as copper wire, may be used. For collector resistance decreases, the positive temperature coefficient element will be connected in series with the emitter, while for collector resistance increases, the positive temperature coefficient element will be connected in series with the base.

In operation, sustained oscillation is achieved for the circuits of Figures 6 and 7 by feeding back signals of sufficient amplitude and proper phase from the collector 20 to the emitter 18. This is accomplished in part by the mutual inductive coupling between the collector winding 56 and the emitter winding 54 and further by the inductive coupling between each of these windings and the inductor 52 in the tank circuit 48. The circuit will oscillate at a frequency which is substantially equal to the resonant frequency of the tank circuit 48 and is variable by means of the tuning capacitor 50. Provision of the temperature compensating thermistor or copper wire in either the base or emitter circuits of the transistor, as referred to above, has been observed to insure continuous and stable oscillation with temperature variations. Thus, the invention may be utilized in a variety of transistor oscillator circuits with the same success. It has also been found that the inclusion of the thermistor will be an aid in maintaining frequency stability.

The circuits illustrated may also be used as ambient temperature indication devices. Thus, for example, since the collector resistance changes with changes in the ambient temperature, the collector current or the amplitude of oscillations will also change. By measuring either of these changes, therefore, an indication of the ambient temperature changes may be easily measured. In an alternate method, the change of ambient temperature may be measured by measuring the changes of the resistance in either the base electrode circuit or in the emitter electrode circuit which is required to compensate for these changes in either collector current or amplitude of oscillations.

While the circuits illustrated in the drawing and described in the specification have all utilized a point-contact transistor having an N type semi-conductive body, it is obvious that a P type point-contact transistor could be used with the same results merely be reversing the biasing voltages. It is also obvious that the features of the invention may be applicable to transistor oscillator circuits of different configurations than the particular configurations illustrated by way of example.

As described herein, means are provided to compensate for operational changes tending toward cessation of oscillations or amplitude and frequency variations of transistor oscillator circuits which are due to temperature variations. Thus, in accordance with the invention, transistor oscillator circuits may effectively be stabilized over a wide temperature range without sacrificing the further goals of circuit simplicity, low cost and reliable performance.

What is claimed is:

1. A sine wave oscillator comprising a semi-conductor device having a semi-conductive body, a base electrode, a collector electrode, and an emitter electrode in contact therewith, means including a source of operating bias connected to a point of substantially fixed potential and with said electrodes for biasing said base and emitter electrodes in a relatively conducting polarity and for biasing said base and collector electrodes in a relatively non-conducting polarity, a parallel resonant circuit tunable to a predetermined frequency connected between said base electrode and said point of fixed potential, and a stabilizing circuit including a thermally sensitive resistance device connected with said base and emitter electrodes to control the impedance of said stabilizing circuit and the oscillation amplitude with temperature variations.

2. In an oscillation generator of the sine wave type the combination comprising, a semi-conductor device having a base, a collector, and an emitter electrode, a feedback circuit providing regenerative feedback and oscillation generation for said generator, means providing energizing potentials for said electrodes, and amplitude stabilization means including a thermally responsive variable resistor connected with said emitter and base electrodes providing impedance control of the circuits defined by said emitter and base electrodes and stable and substantially constant amplitude oscillations of said generator with changes in temperature.

3. An oscillator generator as defined in claim 2 wherein said feedback circuit applies signals from said collector to said emitter electrode in amplitude and phase to sustain oscillation.

4. An oscillation generator as defined in claim 2 wherein said resistor has a negative temperature coefficient of resistance.

5. An oscillation generator as defined in claim 2 wherein said resistor has a positive temperature coefficient of resistance.

6. An oscillator circuit comprising a semi-conductor device having a semi-conductive body, a base electrode, a collector electrode, and an emitter electrode in contact therewith, means including a source of operating bias potential connected to a point of substantially fixed potential and said electrodes for biasing said base and emitter electrodes in a relatively conducting polarity and for biasing said base and collector electrodes in a relatively non-conducting polarity, an amplitude stabilization resistor having a negative temperature coefficient of resistance connected with said base electrode for stabilizing said oscillator circuit and maintaining the amplitude of oscillations substantially constant with temperature variations, and a parallel resonant circuit tunable to said predetermined frequency and connected in series between said resistor and said point of fixed potential.

7. An oscillator comprising in combination, a semi-conductor device having a base, a collector, and an emitter electrode, means providing energizing potentials for said electrodes, positive feedback means for applying signals from said collector to said emitter electrode in amplitude and phase to sustain oscillation, and amplitude stabilization means including a resistor having a negative temperature coefficient connected with said base electrode providing impedance control of the circuit defined by said base electrode to maintain the amplitude of oscillations substantially constant and to provide stable operation of said device with changes in temperature.

8. An oscillator comprising in combination, a semi-conductor device having a base, a collector, and an emitter electrode, means providing energizing potentials for said electrodes, positive feedback means for applying signals from said collector to said emitter electrode in amplitude and phase to sustain oscillation, and amplitude stabilization means including a resistor having a negative temperature coefficient connected with said emitter electrode to maintain the amplitude of oscillations substantially constant and providing stable operation of said device with changes in temperature.

9. An oscillator comprising a semi-conductor device having a semi-conductive body, a base electrode, a collector electrode, and an emitter electrode in contact therewith, means including a source of operating bias potential connected to a point of substantially fixed potential and said electrodes for biasing said base and said emitter electrodes in a relatively conducting polarity and for biasing said base and said collector electrodes in a relatively non-conducting polarity, a first resistor connected between said source of bias and said emitter electrode, a second resistor connected between said source of bias and said collector electrode, amplitude stabilization means including a further resistor having a negative temperature coefficient of resistance connected with said base electrode for providing substantially constant amplitude oscillations for stabilizing said oscillator with temperature variations, and a parallel resonant circuit tunable to a predetermined frequency connected in series between said further resistor and said point of fixed potential.

10. An oscillator comprising a semi-conductor device having a semi-conductive body, a base electrode, a collector electrode, and an emitter electrode in contact therewith, means including a source of operating bias potential connected to a point of substantially fixed potential and said electrodes for biasing said base and said emitter electrodes in a relatively conducting polarity and for biasing said base and collector electrodes in a relatively non-conducing polarity, a first resistor connected between said source of bias and said collector electrode, a second resistor connected with said base electrode, a parallel resonant circuit tunable to a predetermined frequency connected between said second resistor and said point of fixed potential, and amplitude stabilization means including a further resistor having a negative temperature coefficient of resistance connected in series between said emitter electrode and said source of operating bias potential effective in said connection for maintaining substantially constant amplitude oscillations with temperature variations.

11. A since wave oscillator comprising a semi-conductor device having a semi-conductive body, a base electrode, a collector electrode, and an emitter electrode in contact therewith, means including a source of operating bias connected to a point of substantially fixed potential and said electrodes for biasing said base and said emitter electrodes in a relatively conducting polarity and for biasing said base and said collector electrodes in a relatively non-conducting polarity, a first resistor having a negative temperature coefficient of resistance connected with said base electrode for maintaining the amplitude of oscillations substantially constant with temperature variations, a parallel resonant circuit tunable to a predetermined frequency connected between said first resistor and said point of fixed potential, and a feedback connection including a second resistor connected between a predetermined point in said resonant circuit to said emitter electrode.

12. An oscillation generator comprising a semi-conductor device having a semi-conductive body, a base electrode, a collector electrode, and an emitter electrode in contact therewith, means including a source of operating bias connected to a point of substantially fixed potential and said electrodes for biasing said base and emitter electrodes in a relatively conducting polarity and for biasing said base and collector electrodes in a relatively non-conducting polarity, a first resistor having a negative temperature coefficient of resistance connected with said emitter electrode for maintaining the amplitude of oscillations substantially constant with temperature variations, a parallel resonant circuit tunable to a predetermined frequency connected between said base electrode and said point of fixed potential, and a feedback connection including a second resistor connected between a predetermined point in said resonant circuit to said emitter electrode.

13. In an oscillator circuit of the sine wave type the combination comprising; a semi-conductor device having base, emitter and collector electrodes; means providing a source of potential for biasing said device for amplifier operation; feedback means providing regenerative feedback between said collector and emitter electrodes including a first inductor connected in series with said collector electrode, a second inductor connected in series with said emitter electrode, and a frequency determining circuit inductively coupled with said first and second inductors; a resistor connected in series between said second inductor and said source; and temperature sensitive impedance means serially connected with said base electrode and said source for stabilizing said oscillator circuit with temperature variations.

References Cited in the file of this patent

UNITED STATES PATENTS

| | | |
|---|---|---|
| 2,111,086 | Basim | Mar. 15, 1938 |
| 2,681,996 | Wallace | June 22, 1954 |

FOREIGN PATENTS

| | | |
|---|---|---|
| 461,118 | Italy | Jan. 15, 1951 |
| 498,396 | Belgium | Jan. 15, 1951 |